(12) United States Patent
Tsuji

(10) Patent No.: US 9,735,311 B2
(45) Date of Patent: Aug. 15, 2017

(54) METHOD FOR PRODUCING SEMICONDUCTOR LIGHT RECEIVING DEVICE

(71) Applicant: SUMITOMO ELECTRIC INDUSTRIES, LTD., Osaka (JP)

(72) Inventor: Yukihiro Tsuji, Kawasaki (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/962,707

(22) Filed: Dec. 8, 2015

(65) Prior Publication Data

US 2016/0172530 A1 Jun. 16, 2016

(30) Foreign Application Priority Data

Dec. 10, 2014 (JP) .................................. 2014-249998

(51) Int. Cl.
*H01L 21/00* (2006.01)
*H01L 31/18* (2006.01)
(Continued)

(52) U.S. Cl.
CPC ...... *H01L 31/184* (2013.01); *H01L 27/14652* (2013.01); *H01L 27/14694* (2013.01);
(Continued)

(58) Field of Classification Search
CPC ............. H01L 27/11582; H01L 21/324; H01L 21/28282; H01L 438/287;
(Continued)

(56) References Cited

U.S. PATENT DOCUMENTS 6,625,195 B1 9/2003 Henrichs
2003/0185266 A1 10/2003 Henrichs
(Continued)

FOREIGN PATENT DOCUMENTS

WO 2011-089949 7/2011

OTHER PUBLICATIONS

Notice of Allowance issued Sep. 7, 2016 in U.S. Appl. No. 14/962,793.

*Primary Examiner* — Julio J Maldonado
*Assistant Examiner* — Stanetta Isaac
(74) *Attorney, Agent, or Firm* — Smith, Gambrell & Russell, LLP

(57) ABSTRACT

A method for producing a semiconductor light receiving device includes the steps of growing a stacked semiconductor layer including a light-receiving layer having a super-lattice structure, the super-lattice structure including first and second semiconductor layers stacked alternately; forming a mesa structure by etching the stacked semiconductor layer, the mesa structure having a side surface exposed in an atmosphere; forming a deposited layer on the side surface of the mesa structure by supplying a silicon raw material, the deposited layer containing silicon generated from the silicon raw material; and, after the step of forming the deposited layer, forming a passivation film on the side surface of the mesa structure. The first semiconductor layer contains gallium as a constituent element. In the step of forming the deposited layer, the silicon raw material is supplied without supplying an oxygen raw material containing an oxygen element.

10 Claims, 8 Drawing Sheets

(51) Int. Cl.
*H01L 31/0352* (2006.01)
*H01L 27/146* (2006.01)

(52) U.S. Cl.
CPC ........... *H01L 31/035236* (2013.01); *H01L 31/035281* (2013.01); *H01L 31/1868* (2013.01); *Y02E 10/544* (2013.01); *Y02P 70/521* (2015.11)

(58) Field of Classification Search
CPC ..... H01L 21/823462; H01L 21/823857; H01L 29/7808; H01L 27/11273; H01L 29/7802; H01L 29/66712
USPC ....... 438/137, 138, 156, 173, 192, 206, 209, 438/212, 268; 257/328, E21.676, 257/E21.693
See application file for complete search history.

(56) References Cited

U.S. PATENT DOCUMENTS

| | | | |
|---|---|---|---|
| 2005/0048705 A1* | 3/2005 | Burnham | H01L 29/518 438/197 |
| 2008/0254203 A1* | 10/2008 | Zhou | C23C 16/345 427/74 |
| 2009/0165839 A1 | 7/2009 | Zeman et al. | |
| 2014/0197373 A1* | 7/2014 | Iguchi | H01L 27/1446 257/13 |
| 2015/0311366 A1* | 10/2015 | Tsuji | H01L 31/105 257/21 |

* cited by examiner

METHOD FOR PRODUCING SEMICONDUCTOR LIGHT RECEIVING DEVICE

BACKGROUND OF THE INVENTION

1. Field of the Invention

The present invention relates to a method for producing a semiconductor light receiving device.

2. Description of the Related Act

International Publication No. WO2011-089949 discloses a compound semiconductor photodiode array. The photodiode array is combined with a silicon read-out integrated circuit (ROIC) to constitute a photodetector module.

Image sensors include, for example, a photodiode array that includes a plurality of photodiodes. Such a photodiode array is classified into a planar-type photodiode array and a mesa-type photodiode array. In the mesa-type photodiode array, pixels are arranged at higher density as compared with the planar-type photodiode array. By arranging pixels at high density, a high-resolution image sensor is produced. In image sensors including a mesa-type photodiode array, each of the photodiodes includes a mesa structure. In addition, the mesa structure includes an optical absorption layer having a super-lattice structure, for example. The super-lattice structure included in the optical absorption layer is exposed in an atmosphere at a side surface of the mesa structure. In general, the exposed side surface of the mesa structure is covered with a passivation film to protect the side surface of the mesa structure.

SUMMARY OF THE INVENTION

However, it was found that the mesa-type photodiode including a super-lattice structure in the optical absorption layer has a relatively large dark current that is generated at an interface between the super-lattice structure and the passivation film formed on the side surface of the mesa structure. Such a dark current is measured as a current flowing between electrodes of the photodiode. The dark current deteriorates the S/N ratio of an image sensor.

The side surface of the mesa structure formed by etching is exposed in the air (atmosphere) until a passivation film is formed on the side surface of the mesa structure. As a result of this exposure, native oxides of semiconductor material in the super-lattice structure are unintentionally formed on the side surface of the mesa structure. It was also found that the formation of the native oxides generates a dark current at an interface between the passivation film and the side surface of the super-lattice structure.

A method for producing a semiconductor light receiving device according to the present invention includes the steps of growing a stacked semiconductor layer on a principal surface of a substrate, the stacked semiconductor layer including a light-receiving layer having a super-lattice structure, the super-lattice structure including a first semiconductor layer and a second semiconductor layer that are stacked alternately; forming a mask on the stacked semiconductor layer; forming a mesa structure on the substrate by etching the stacked semiconductor layer using the mask so as to form a substrate product, the mesa structure having a side surface exposed in an atmosphere; forming a deposited layer on the side surface of the mesa structure by supplying a silicon raw material, the deposited layer containing silicon generated from the silicon raw material; and, after the step of forming the deposited layer, forming a passivation film on the side surface of the mesa structure. The first semiconductor layer contains gallium as a constituent element. The second semiconductor layer contains a material different from a material of the first semiconductor layer. In addition, in the step of forming the deposited layer, the silicon raw material is supplied without supplying an oxygen raw material containing an oxygen element.

The above object, other objects, features, and advantages of the present invention are more easily understood from the following detailed description of preferred embodiments of the present invention, the description being made with reference to the attached drawings.

DESCRIPTION OF THE PREFERRED EMBODIMENTS

Figure 1A:
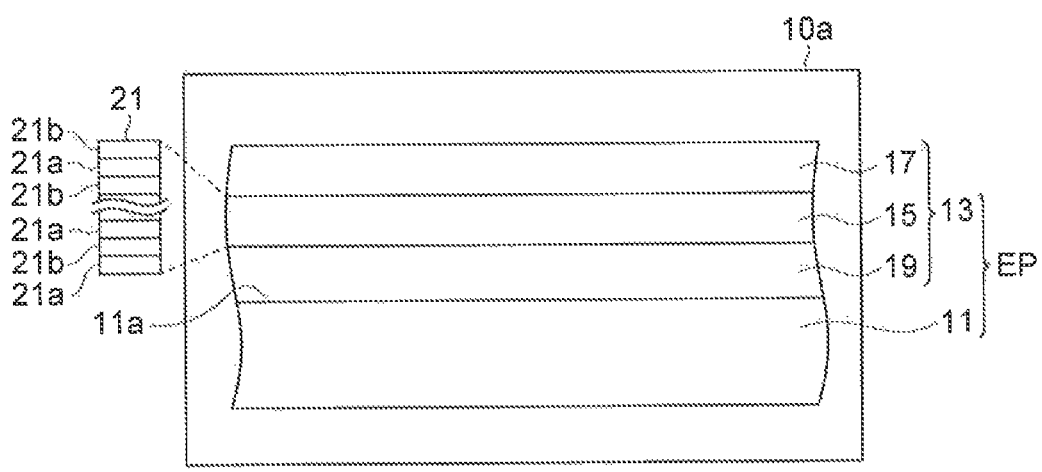
FIGS. 1A and 1B schematically illustrate main steps in a method for producing a semiconductor light receiving device according to the embodiment.

Some embodiments will be described below.

A method for producing a semiconductor light receiving device according to an embodiment includes the steps of (a) growing a stacked semiconductor layer on a principal surface of a substrate, the stacked semiconductor layer including a light-receiving layer having a super-lattice structure, the super-lattice structure including a first semiconductor layer and a second semiconductor layer that are stacked alternately; (b) forming a mask on the stacked semiconductor layer; (c) forming a mesa structure on the substrate by etching the stacked semiconductor layer using the mask so as to form a substrate product, the mesa structure having a side surface exposed in an atmosphere; (d) forming a deposited layer on the side surface of the mesa structure by supplying a silicon raw material, the deposited layer containing silicon generated from the silicon raw material; and, (e) after the step of forming the deposited layer, forming a passivation film on the side surface of the mesa structure. The first semiconductor layer contains gallium as a constituent element. The second semiconductor layer contains a material different from a material of the first semiconductor layer. In addition, in the step of forming the deposited layer, the silicon raw material is supplied without supplying an oxygen raw material containing an oxygen element.

In the method for producing a semiconductor light receiving device, in the step of forming the deposited layer, the silicon raw material may contain at least one of an inorganic silane compound and an organic silane compound.

In this method for producing a semiconductor light receiving device, the deposited layer containing silicon generated from the silicon raw material is formed on the side surface of the mesa structure before the passivation film is formed on the side surface of the mesa structure. The mesa structure includes the light-receiving layer having the super-lattice structure. The side surface of the mesa structure is exposed in an air (atmosphere) after forming the mesa structure on the substrate by etching the stacked semiconductor layer. An oxide (for example, gallium oxide) of a constituent element (for example, gallium) of a group compound semiconductor contained in the super-lattice structure is formed on the side surface of the super-lattice structure in the mesa structure. In the step of forming the deposited layer containing silicon, a silicon compound is supplied to the side surface of the mesa structure in the substrate product as a silicon raw material. For example, the silicon compound contains at least one of a silicon-containing inorganic compound such as an inorganic silane compound and a silicon-containing organic compound such as an organic silane compound. In the step of forming the deposited layer containing silicon, the silicon raw material is supplied, but the oxygen raw material containing the oxygen element are not supplied. Therefore, the silicon raw material is contained in the atmosphere in which the side surface of the mesa structure is exposed, but the oxygen raw material containing the oxygen element is not contained in the atmosphere. The deposited layer containing silicon is formed on the oxide (for example, gallium oxide) of the constituent element of the semiconductor layers in the super-lattice structure. The deposited layer does not contain silicon dioxide. After the formation of the deposited layer, the passivation film is formed. The silicon in the deposited layer reacts with oxygen in the oxide of the constituent element of the semiconductor layers in the super-lattice structure so as to form a bond of oxygen and silicon. As a result of the formation of the bond of silicon and oxygen, the amount of the oxide of the constituent element formed on the side surface of the super-lattice structure in the mesa structure is reduced.

The oxide is unintentionally formed on the side surface of the super-lattice structure in the mesa structure after the formation of the mesa structure and before the formation of the passivation film. This oxide contains a compound (for example, gallium oxide) of oxygen and a constituent element (for example, Ga) of the III-V group compound semiconductor constituting the super-lattice structure. The residual oxide between the passivation film and the side surface of the mesa structure increases a dark current in the semiconductor light receiving device.

The amount of the oxide (oxide of constituent element of the semiconductor layers in the super-lattice structure) formed on the side surface of the super-lattice structure is reduced by supplying the silicon compound as a silicon raw material so as to form the deposited layer containing silicon. Consequently, a dark current due to the oxide formed on the side surface of the mesa structure is reduced.

In the method for producing a semiconductor light receiving device, the deposited layer may be formed by exposing the substrate product in plasma containing the silicon raw material.

In the method for producing a semiconductor light receiving device, the deposited layer may be formed by applying the silicon raw material on the side surface of the mesa structure.

In the method for producing a semiconductor light receiving device, the deposited layer may be formed by exposing the substrate product in an atmosphere of the silicon raw material.

In the method for producing a semiconductor light receiving device, the silicon raw material may contain at least one of $SiH_4$ and $Si_2H_6$.

In the method for producing a semiconductor light receiving device, the silicon raw material may contain tetraethoxysilane.

In the method for producing a semiconductor light receiving device, the passivation film may be made of silicon dioxide, silicon oxy-nitride, or aluminum oxide.

In the method for producing a semiconductor light receiving device, the the first semiconductor layer of the super-lattice structure may be made of GaSb, and the second semiconductor layer of the super-lattice structure may be made of InAs.

The findings of the present invention can be easily understood from the following detailed description with reference to the attached drawings shown as an example. An embodiment of the method for producing a semiconductor light receiving device will be described with reference to the attached drawings. The same parts are designated by the same reference numerals where applicable.

FIG. 1A to FIG. 4 schematically illustrate main steps in the method for producing a semiconductor light receiving device according to this embodiment. First, a substrate 11 to grow semiconductor layers thereon is prepared. The substrate 11 is placed in a growth furnace 10a. As illustrated in FIG. 1A, a stacked semiconductor layer 13 for forming a semiconductor light receiving device is epitaxially grown on a principal surface 11a of the substrate 11. The substrate 11 is made of for example, GaSb, InP, InSb, or GaAs. The stacked semiconductor layer 13 is grown by using a molecular beam epitaxial growth (MBE) method or a metal-organic vapor phase epitaxy (MOVPE) method, for example. The stacked semiconductor layer 13 includes a semiconductor layer 15 and a first-conductivity-type semiconductor layer 17 disposed on the semiconductor layer 15. The semiconductor layer 15 includes a light-receiving layer in which a photo-current is generated by absorption of light. The first-conductivity-type semiconductor layer 17 is made of a III-V group compound semiconductor. The stacked semiconductor layer 13 may optionally include a second-conductivity-type semiconductor layer 19 made of a III-V group compound semiconductor between the semiconductor layer 15 and the substrate 11. The conductivity type of the first-conductivity-type semiconductor layer 17 is opposite to the conductivity type of the second-conductivity-type semiconductor layer 19. When the substrate 11 is made of conductive semiconductor material, the stacked semiconductor layer 13 does not necessarily include the second-conductivity-type semiconductor layer 19. The semiconductor layer 15 includes, for example, a super-lattice structure 21. The super-lattice structure 21 includes first semiconductor layers 21a and second semiconductor layers 21b that are alternately stacked on top of each other. The first semiconductor layers 21a contain gallium and antimony as constituent elements. The second semiconductor layers 21b are made of a material different from the material of the first semiconductor layer 21a. The super-lattice structure 21 includes, for example, a GaSb/InAs super-lattice. Through these processes, an epitaxial wafer EP is produced. This epitaxial wafer EP includes the substrate 11 and the stacked semiconductor layer 13. Example of epitaxial wafer EP Substrate 11: p-type GaSb substrate
First-conductivity-type semiconductor layer 17: InAs
Super-lattice structure 21 in semiconductor layer 15:
    number of repetitions: 100 layers to 500 layers
    First semiconductor layer 21a: GaSb (thickness 1 nm to 5 nm)
    Second semiconductor layer 21b: InAs (thickness 1 nm to 5 nm)
Second-conductivity-type semiconductor layer 19: GaSb
The super-lattice structure 21 is not limited to the above-described combination of GaSb/InAs. The super-lattice structure 21 may include InGaAs/GaAsSb super-lattice, for example. The stacked semiconductor layer 13 has a thickness of, for example, 3 μm to 7 μm.

Figure 1B:
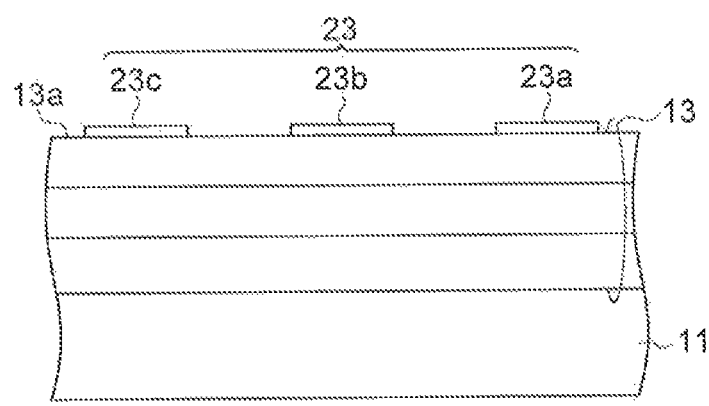

The epitaxial wafer EP is taken out of the growth furnace 10a, and then a mask for forming mesa structures is formed on the stacked semiconductor layer 13. First, an insulating layer is formed on a principal surface 13a of the stacked semiconductor layer 13. The insulating layer is formed by using a chemical vapor deposition (CVD) method. In this embodiment, the insulating layer is made of silicon nitride (SiN). The insulating layer has a thickness of, for example, 100 nm to 500 nm. By using a photolithography method and an etching method, the insulating layer is patterned so as to form a mask 23 as illustrated in FIG. 1B. The mask 23 is used as an etching mask to form semiconductor mesas. The mask 23 has a one-dimensional pattern or a two-dimensional pattern (23a, 23b, and 23c) in accordance with the arrangement of the mesa structures. The mask 23 is made of a material for the insulating layer, such as silicon nitride (SiN). The substrate product produced in this process includes the epitaxial wafer EP and the mask 23.

Figure 2A:
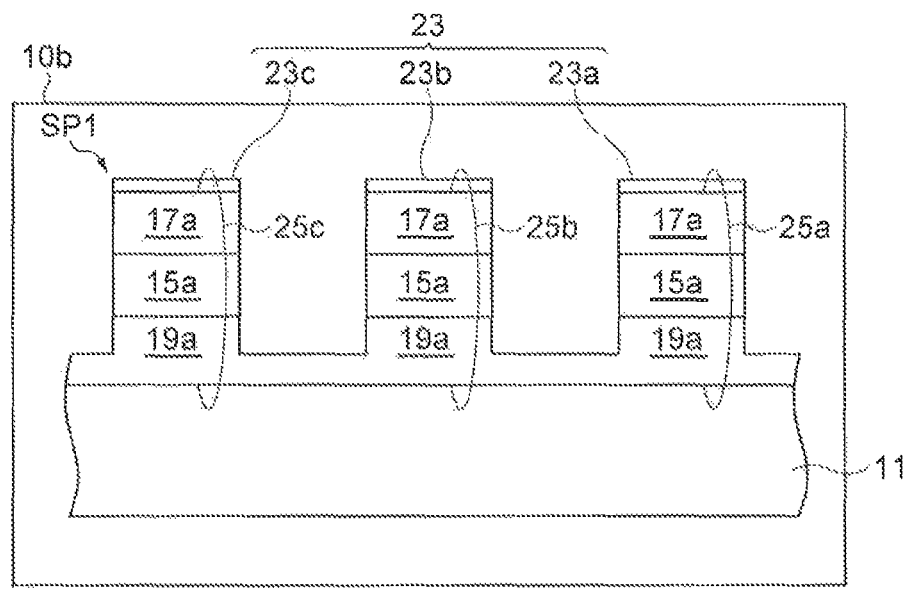
FIGS. 2A and 2B schematically illustrate main steps in the method for producing a semiconductor light receiving device according to the embodiment.

After the formation of the mask. 23, the epitaxial wafer EP is placed in an etching apparatus 10b. As illustrated in FIG. 2A, the epitaxial wafer EP is etched using the mask 23 as the etching mask to form a substrate product SP1. The super-lattice structure 21 of the semiconductor layer 15 is etched by, for example, dry etching or wet etching. In the dry etching process, an inductively coupled plasma reactive ion etching (ICP RIB) method is used, for example. In the ICP RIE method, a halogen gas (e.g., $Cl_2$, $BCl_3$, HI, or $SiCl_4$) or a mixed gas containing a hydrocarbon gas (e.g., methane gas) and a hydrogen gas is used as an etching gas, for example. When the wet etching is applied, for example, a citric acid base etchant is used.

Referring to FIG. 2A, the substrate product SP1 includes mesa structures 25a, 25b, and 25c formed from the stacked semiconductor layer 13. In the embodiment, the mesa structures 25a, 25b, and 25c are formed by etching the stacked semiconductor layer 13 with using the dry etching method. The mesa structures 25a, 25b, and 25c correspond to the patterns 23a, 23b, and 23c of the mask 23, respectively. Each of the mesa structures 25a, 25b, and 25c includes a first-conductivity-type semiconductor layer 17a formed from the first-conductivity-type semiconductor layer 17, a light-receiving layer 15a formed from the semiconductor layer 15, and a second-conductivity-type semiconductor layer 19a. formed from the second-conductivity-type semiconductor layer 19. The light-receiving layer 15a, includes the super-lattice structure 21 and is disposed between the first-conductivity-type semiconductor layer 17a and the second-conductivity-type semiconductor layer 19a. The height of the mesa structures 25a, 25b, and 25c is dependent on the thickness of the stacked semiconductor layer 13 and is, for example, 1 to 5 μm.

The substrate product SP1 is taken out of the etching apparatus 10b and then the mask 23 is removed. For example, a buffered hydrofluoric acid is used to remove the mask 23 made of silicon nitride.

FIGS. 5A to 5D schematically illustrate a cross-section of the super-lattice structure 21 of the light-receiving layer 15a in the mesa structure. FIGS. 5A to 5D illustrate the four steps from the pretreatment step to the passivation forming step, respectively.

Figure 2B:
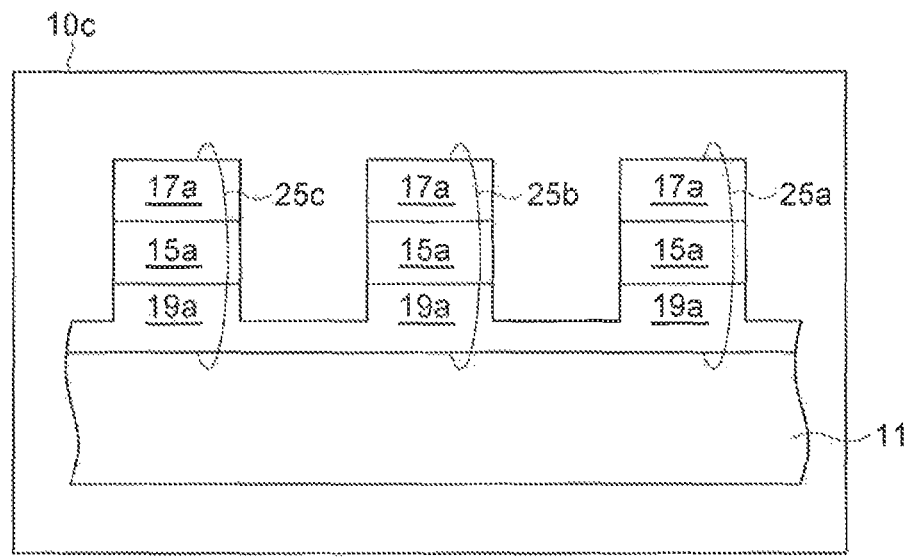
Figure 5A:
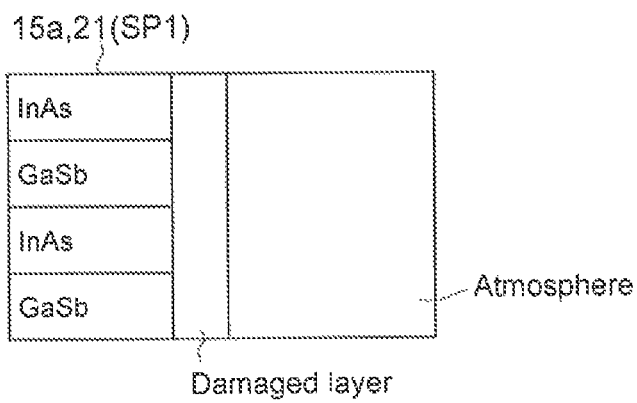
FIGS. 5A to 5D schematically illustrate the surface of a super-lattice structure of a light-receiving layer in main steps from a pretreatment step to a passivation film formation step in the method for producing a semiconductor light receiving device according to the embodiment.
Figure 5B:
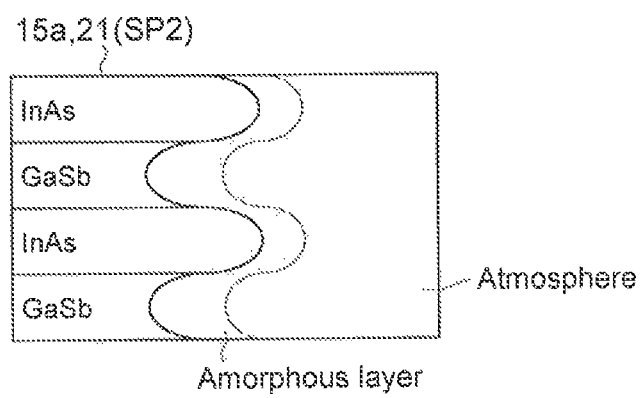

After forming the substrate product SP1 by etching the stacked semiconductor layer 13, a damaged layer is left on the side surface of the mesa structure, as illustrated in FIG. 5A. The substrate product SP1 is placed in a treatment apparatus 10c. For example, the following treatment is performed on the substrate product SP1 in the treatment apparatus 10c, as illustrated in FIG. 2B. First, the damaged layer formed on the side surface of the mesa structure of the substrate product SP1 is removed, in this treatment of removing the damaged layer, a mixed solution of phosphoric acid, hydrogen peroxide, and water is used, for example. The mixing ratio of the mixed solution is, for example, phosphoric acid/hydrogen peroxide/water=1/2/20. The substrate product SP1 is immersed in the mixed solution, and then the substrate product SP1 is rinsed with ultrapure water. The rinse with ultrapure water is performed for, for example, 5 to 10 minutes. After the rinse with ultrapure water, an amorphous layer is formed on the side surface of the super-lattice structure 21 in the mesa structure of the substrate product SP1 as illustrated in FIG. 5B. The amorphous layer contains elements constituting the super-lattice structure 21, such as gallium (Ga), arsenic (As), antimony (Sb), or indium (In). The amorphous layer also contains a compound of oxygen and one of the constituent elements of the super-lattice structure 21 such as gallium. The ultrapure water slightly contains oxygen (e.g., 5 to 10 ppb). The constituent elements of the super-lattice structure 21 have oxidizing properties different from each other. Referring to FIG. 5B, on the side surface of the super-lattice structure 21, each layer constituting the super-lattice structure has a characteristic structure in accordance with the oxidation tendency of the constituent elements. An amorphous layer having a thickness of about 5 to 10 nm is preferably formed by controlling the pretreatment time (e.g., rinsing time). Through these pretreatment processes, a substrate product SP2 is produced from the substrate product SP1. After the removal of the damaged layer, the side surface of the super-lattice structure 21 in the mesa structure is exposed in the air (atmosphere).

Figure 3A:
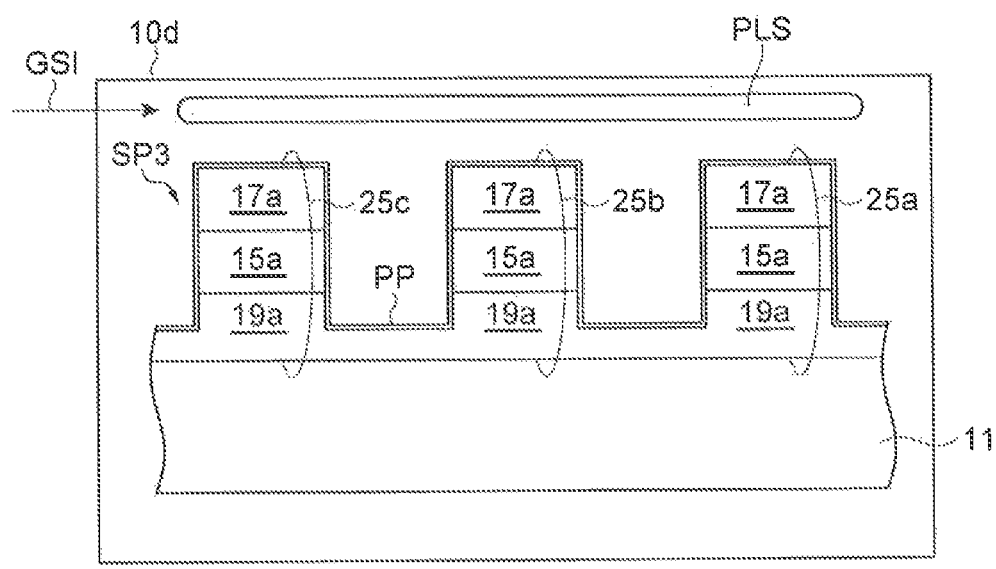
FIGS. 3A and 3B schematically illustrate main steps in the method for producing a semiconductor light receiving device according to the embodiment.
Figure 5C:
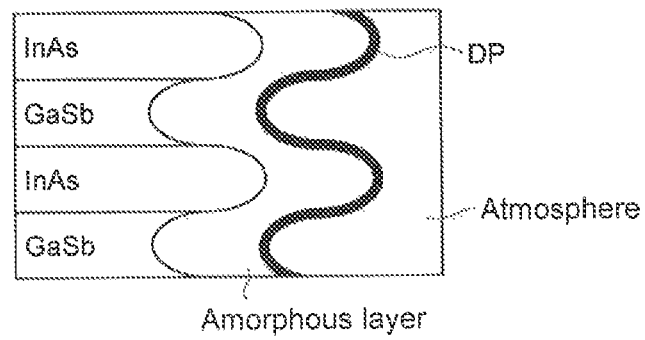

After the removal of the damaged layer, as illustrated in FIG. 3A, the substrate product SP2 is placed in a plasma treatment apparatus 10d. The plasma treatment apparatus 10d may also be used to form an insulating layer such as a $SiO_2$ layer or a SiN layer. For example, in the step illustrated in FIG. 3A, the substrate product SP2 is exposed in plasma PUS containing, for example, a silicon raw material GSI. In the plasma treatment apparatus 10d, the silicon raw material GSI is supplied to the substrate product SP2 to form a deposited layer DP on the substrate product SP2 as illustrated in FIG. 5C. Herein, the deposited layer DP contains silicon generated as a result of decomposition of the silicon raw material GSI. Thus, a substrate product SP3 is produced from the substrate product SP2.

For forming the deposited layer DP the substrate product SP2 is exposed in an atmosphere containing the silicon raw material GSI. In other methods of forming the deposited layer DP, the substrate product SP2 may be exposed in plasma containing the silicon raw material GSI. In addition, the silicon raw material GSI may be applied to the surface of the substrate product SP2 for forming the deposited layer DR in this embodiment, a gaseous silicon raw material GSI is supplied to the treatment apparatus 10d. Although the silicon raw material GSI is supplied, an oxygen raw material is not supplied. Therefore, the deposited layer DP substantially contains silicon generated as a result of decomposition of the silicon raw material GSI. The silicon raw material GSI may contain, for example, at least one of an inorganic silane compound and an organic silane compound. As illustrated in FIG. 5C, the deposited layer DP is formed on the amorphous layer on the side surface of the super-lattice structure 21 in the mesa structure.

In the method of forming the deposited layer DP by using the plasma treatment, an amorphous silicon film may be formed by introducing an inorganic silane gas (e.g., $SiH_4$ and $Si_2H_6$) into a plasma CVD apparatus and performing plasma discharging. In the formation of the amorphous silicon film, nitrogen, hydrogen, or helium may be used as a dilution gas. Since amorphous silicon has conductivity, an amorphous silicon film having a large thickness forms another leakage path. The thickness of the amorphous silicon film is 1 nm or less, for example. The film deposition rate of the amorphous silicon film is preferably controlled to be 10 nm/min or less. A low film deposition rate of the amorphous silicon film promotes a reaction between oxygen of an oxide in the base amorphous layer and the amorphous silicon film. The substrate temperature is set to be 100° C. to 200° C., for example. The inorganic silicon raw material that is selected as one of the silicon raw material GSI may contain at least one of $SiH_4$ and $Si_2H_6$. The organic silicon raw material that is selected as another silicon raw material GSI may contain tetraethoxysilane (TEOS).

The following conditions are exemplified for forming the deposited layer DP.
Substrate temperature: 150° C.
Pressure in chamber: 1.7 Torr
Flow rate of $SiH_4$: 5 sccm
Treatment time: 5 seconds
Film deposition rate: 10 nm/min
Through this treatment, an amorphous silicon film having a thickness of about 1 nm is formed, and the silicon film has a refractive index of 2.2 to 3.9.

The deposited layer DP may be formed by other methods without using plasma. For example, the deposited layer DP may be formed in a gaseous atmosphere containing the silicon raw material GSI. Specifically, an atmosphere containing the silicon raw material GSI is generated in a chamber of the treatment apparatus 10d. Furthermore, the deposited layer DP is formed on the substrate product SP2 in this atmosphere containing the silicon raw material GSI. In this method, the silicon raw material GSI contains a trihalogenated organic silane, a trialkoxy organic silane, or the like. The substrate temperature is set to be 100° C. to 200° C., for example. During the formation of the deposited layer DP in the gaseous atmosphere, deposited Si bonds to oxygen in the base amorphous layer.

The deposited layer DP may also be formed by applying the silicon raw material GSI to the surface of the substrate product SP2. In this method, the deposited layer DP may be formed by applying a silicon-containing organic material onto a wafer surface. The silicon-containing organic material includes an organic silane-based material that has at least one organic molecules group as a functional group combined with a silicon atom. For example, an organic silane-based coating film may be formed by a spin coating method. The organic silane-based coating film has a function of promoting oxidation of a silicon atom. Therefore, the organic silane-based coating film is preferably made of a monolayer. The organic silane-based coating film is preferably made of trihalogenated organic silane, or trialkoxy organic silane, for example. The substrate temperature is set to be, for example, 100° C. to 200° C. to form the deposited layer DP.

The organic silane-based coating film is formed on the amorphous layer formed through the pretreatment. The organic silane-based coating film may also be formed by a vapor deposition method instead of the spin coating method. The organic silane monomolecular film is formed by adhesion of single molecules of the organic slime in the irregularities on the substrate and thus covers the surface of the substrate product SP2. Herein, the silicon atom in the organic silane molecule bonds to oxygen of an oxide in the amorphous layer during the formation of the passivation film, and thus an O—Si—O bond is formed. The organic silane-based coating film is a mechanically, thermally, and chemically stable film. As a result of the formation of this bond, oxygen is removed from the amorphous layer. This decreases the amount of an oxide in the amorphous layer, and increases the proportion of the amorphous layer containing elements of gallium (Ga), arsenic (As), antimony (Sb), or indium (In). Since the amount of the oxide of the constituent element decreases, the leak current generated at the side surface of the mesa structure is reduced.

Silicon dioxide ($SiO_2$) is a material more stable than oxides of the constituent elements of the super-lattice structure 21 such as gallium (Ga), arsenic (As), antimony (Sb), or indium (In) from the viewpoint of the standard production enthalpy of oxides. Therefore, oxygen in the oxide of the constituent elements in the base semiconductor layer in the super-lattice structure 21 is dissociated by using a deposited layer DP that contains silicon as a principal constituent element and substantially does not contain oxygen or a deposited layer DP substantially made of silicon. Furthermore, the leaving oxygen forms a bond with silicon. As a result of this reaction, stable silicon dioxide is formed. After the formation of the deposited layer DP by any of the above methods, the substrate product is heat-treated in a nitrogen atmosphere, for example. The heat treatment temperature is, for example, 150° C. to 200° C. The heat treatment time is, for example, 1 minute to 10 minutes.

Figure 3B:
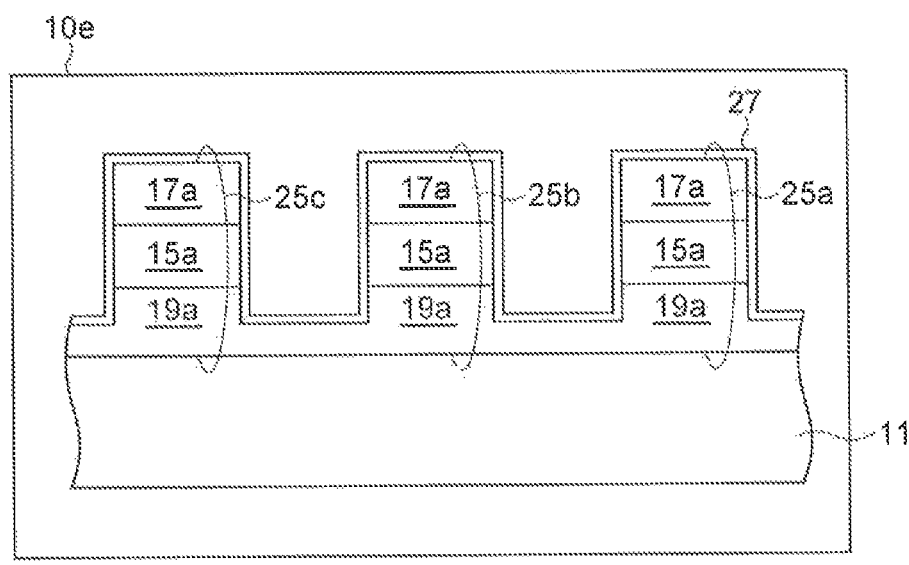

After the deposited layer DP is formed on the substrate product SP2 to form a substrate product SP3, a passivation film 27 is formed on the substrate product SP3 in a film formation apparatus 10e as illustrated in FIG. 3B. The passivation film 27 has a thickness of, for example, 300 nm to 500 nm. For example, silane and nitrous oxide are used as raw material gases to form the passivation film 27. The film formation apparatus 10e is, for example, a capacitively-coupled plasma CVD apparatus or a microwave plasma CVD apparatus.

Figure 5D:
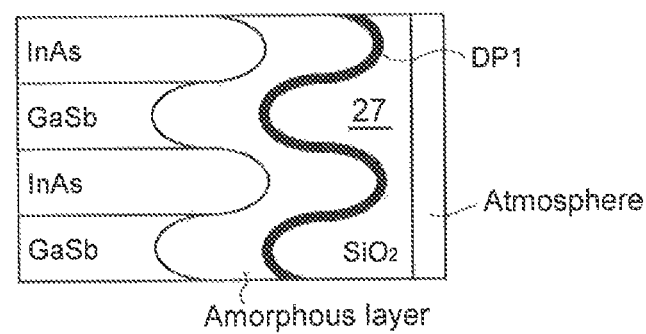

Referring to FIG. 5D, a passivation film 27 is formed on the deposited layer DP or a reaction product DP1 formed from the deposited layer DR. In this embodiment, the passivation film 27 is made of silicon dioxide. The passivation film 27 may made of silkon oxy-nitride or aluminum oxide. The passivation film contains these oxides, and the silicon dioxide, the silicon oxy-nitride, and the aluminum oxide have a good passivation function.

For example, a $SiO_2$ film is formed by using a plasma-enhanced CVD (PE-CVD) method. The film formation temperature is, for example, 150° C. The organic silane-based coating film has heat resistance over about 300° C. Therefore, the organic silane-based coating film left during the formation of the passivation film is not altered. The deposited layer DP and the reaction product DP1 formed from the deposited layer DP function as a barrier against an oxidation source (e.g., oxygen radical) during the formation of the passivation film. Thus, an oxidation source such as an oxygen radical is prevented from directly contacting the semiconductor side surface of the super-lattice structure 21 in the mesa structure. The semiconductor layer exposed at the side surface of the super-lattice structure 21 in the mesa structure is also suppressed from oxidation during the formation of the $SiO_2$ film. Furthermore, when silicon left in the deposited layer DP without being changed into the reaction product DP1 is reacted with an oxidation source during the formation of the passivation film, the amount of silicon in the deposited layer DP is reduced.

In this production method, the deposited layer DP containing silicon generated from the silicon raw material GSI is formed on the substrate product SP1 before the formation of the passivation film 27. In the embodiment, the semiconductor light receiving device has the mesa structures (mesa structures 25a to 25c) in which the light-receiving layer 15a is included. Furthermore, the light-receiving layer 15a includes the super-lattice structure 21. On the side surface of the super-lattice structure 21 in the mesa structure, the amorphous layer containing an oxide is formed. This oxide is, for example, an oxygen compound containing a constituent element (e.g., gallium) in the semiconductor layers (21a and 21b) of the super-lattice structure 21. In the above process, a silicon compound a silicon compound containing at least one of a silicon-containing inorganic compound such as an inorganic silane compound and a silicon-containing organic compound such as an organic silane compound) is supplied to the substrate product SP2 as a silicon raw material. In addition, the mesa structures 25a to 25c are exposed in an etchant for etching the semiconductor layer and an atmosphere substantially not containing oxygen. By supplying the etchant and the gas substantially not containing an oxidation source to the amorphous layer containing the oxide, a deposited layer DP containing silicon but not silicon dioxide is formed. After the formation of the deposited layer DP, the passivation film 27 is formed. The silicon in the deposited layer DP is reacted with oxygen in the oxide of the constituent elements in the super-lattice structure 21 during or after its deposition, and thus a bond between oxygen and silicon is formed. The formation of the bond between the oxygen and silicon reduces the amount of the oxide of the constituent element in the super-lattice structure 21.

In the step of forming the mesa structures 25a to 25c, an oxide is unintentionally formed on the side surfaces of the semiconductor layers (21a and 21b) in the super-lattice structure 21 because the side surfaces of the semiconductor layers (21a and 21b) are exposed in the air (atmosphere). The oxide contains a compound of oxygen and the constituent elements of, for example, gallium (Ga) element, arsenic (As) element, antimony (Sb) element, or indium (In) element in the semiconductor layers (21a and 21b). If a large amount of the oxide is left in the amorphous layer formed between the passivation film 27 and the side surface of the super-lattice structure 21 in each of the mesa structures 25a to 25c, a dark current is generated in the semiconductor light receiving device.

The amount of the oxide (oxide of constituent element in the semiconductor layers (21a and 21b)) formed on the side surface of the super-lattice structure 21 is reduced by supplying silicon through, for example, the plasma treatment of the silicon raw material GSI, the formation of a silicon film, or the application of a silicon-containing organic material on the side surface. This reduces a dark current due to the oxide formed on the side surface of the mesa structures.

Figure 4:
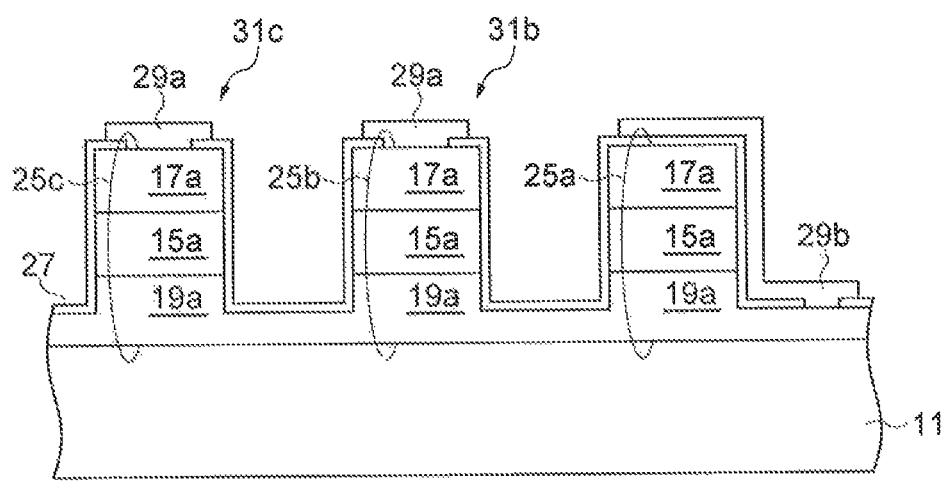
FIG. 4 schematically illustrates a main step in the method for producing a semiconductor light receiving device according to the embodiment.

As illustrated in FIG. 4, after the formation of the passivation film 27, a first opening is formed in the passivation film 27 on the upper surface of each of the mesa structures 25b and 25c. A first electrode 29a (e.g., n-side electrode) of each of photodiodes 31b and 31 is formed in the first opening. The first electrode 29a is made of, for example, Ti/Pt/Au/Ni/Au. The first electrode 29a is formed by, for example, a lift-off method. A second opening is formed in the passivation film 27 on the upper surface of a semiconductor region different from a region of the substrate on which the mesa structures 25a, 25b, and 25c have been formed. A second electrode 29b (e.g., p-side electrode) of the photodiodes 31b and 31c is formed in the second opening. The second electrode 29b extends to the upper surface of the mesa structure 25a. The second electrode 29b is made of, for example, Ti/Pt/Au/Ni/Au. The second electrode 29b is formed by, for example, a lift-off method. The first electrode 29a is in ohmic contact with the top surface of the mesa structures 25b and 25c (first-conductivity-type semiconductor layer 17a) exposed through the first opening of the passivation film 27. The second electrode 29b is in ohmic contact with the top surface of the second-conductivity-type semiconductor layer 19a exposed through the second opening of the passivation film 27. When the substrate 11 has conductivity, the second electrode 29b may be disposed on the back of the substrate.

Figure 6A:
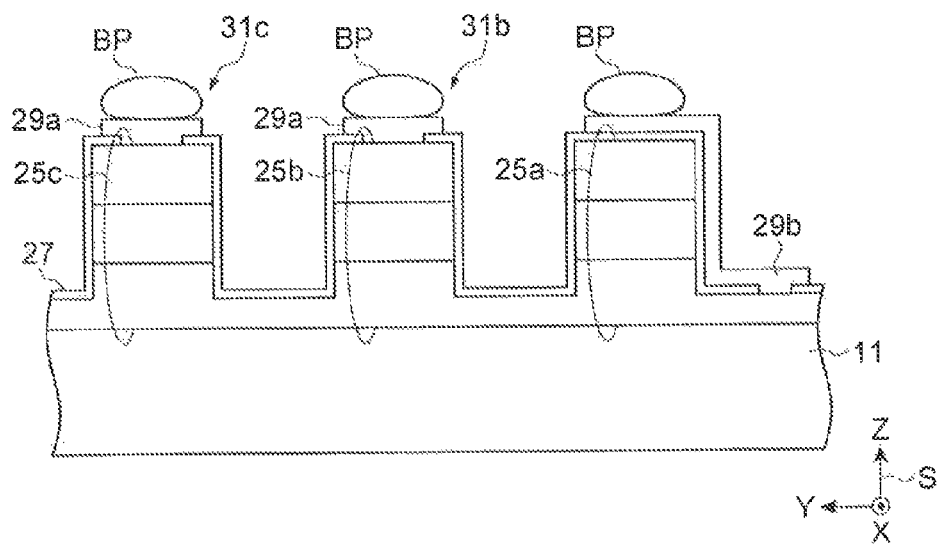
FIGS. 6A and 6B schematically illustrate a semiconductor light receiving device according to the embodiment.
Figure 6B:
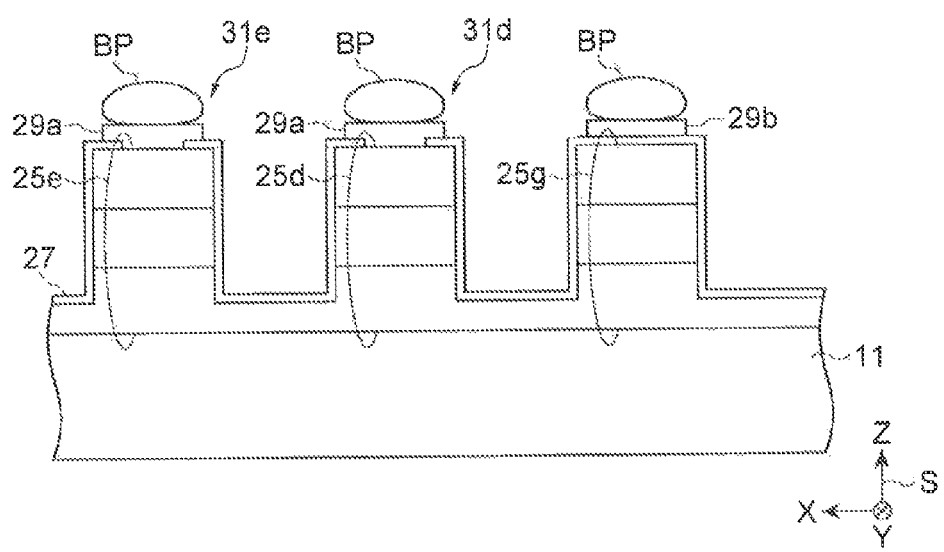

After these processes, a bump electrode BP (e.g., indium (In) bump electrode BP) may be optionally formed on the first electrode 29a and the second electrode 29b. The bump electrode BP is formed by, for example, a lift-off method. Subsequently, the substrate product is cut into individual chips by a dicing process. Thus, a semiconductor light receiving device 33 including a photodiode array is produced as illustrated in FIGS. 6A and 6B. The semiconductor light receiving device 33 includes an array of photodiodes 31b to 31e that are two-dimensionally arranged in the X-axis direction and Y-axis direction of the rectangular coordinate system S. The photodiodes 31b to 31e correspond to the mesa structures 25b to 25e, respectively.

Figure 7:
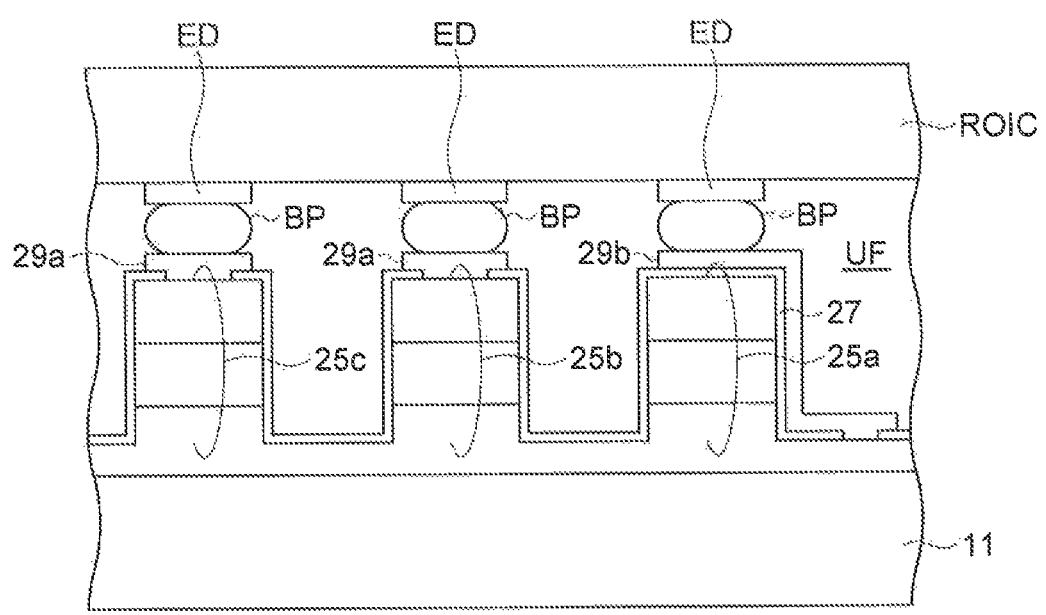
FIG. 7 schematically illustrates an image sensor according to the embodiment.

As illustrated in FIG. 7, the electrodes (29a and 29b) of the semiconductor light receiving device 33 are joined to electrodes ED of a read-out integrated circuit ROIC by using a flip-chip bonding method with the bump electrodes BP therebetween. A gap between the semiconductor light receiving device 33 and the read-out integrated circuit ROIC is filled with an underfill resin UF. Subsequently, the underfill resin UF is cured by heat treatment. In order to suppress the absorption of incident light, polishing or grinding may be optionally performed on the substrate 11 to decrease the thickness of the substrate 11. For example, when the substrate 11 is made of GaSb, the back surface of the substrate is polished or ground to decrease the thickness of the substrate because the GaSb substrate has a large optical absorption for mid-infrared light. Thus, an infrared-incident surface is formed on the back surface of the substrate. The processed GaSb substrate has a thickness of, for example, about 100 μm.

Figure 8A:
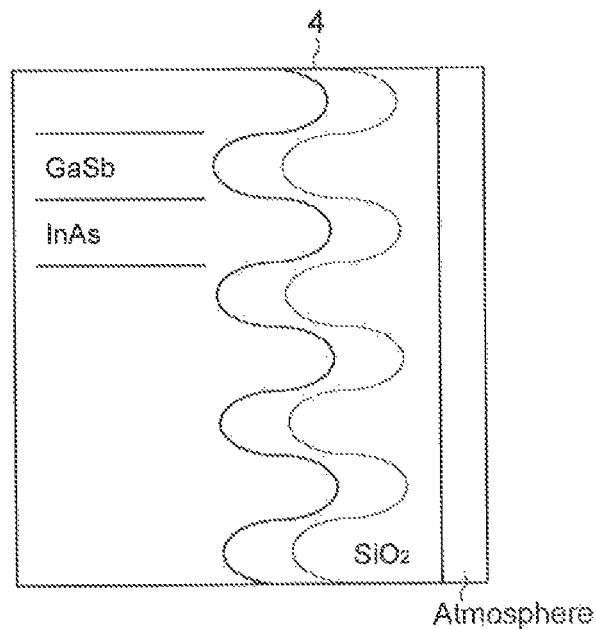
FIGS. 8A and 8B schematically illustrate a passivation structure formed by the method for producing a semiconductor light receiving device according to the embodiment and a passivation structure different from the above passivation structure.
Figure 8B:
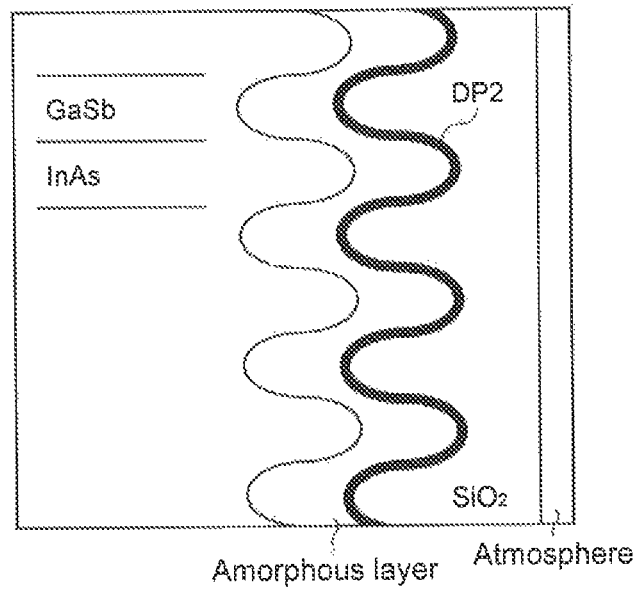

In the process flow of mid-infrared image sensors, the structure of the passivation film is important to reduce a dark current. FIG. 8A schematically illustrates a structure 4 in which the passivation film is directly formed on the side surface of the super-lattice structure in each of the mesa structures. A compound of silicon and oxygen is contained in a semiconductor (in a depressed portion of the amorphous layer corresponding to the position of a GaSb layer in the super-lattice structure) of the structure 4. When the passivation film (for example, $SiO_2$ film) containing an oxide is formed, the side surface of the super-lattice structure in the mesa structure is exposed in an oxidation source such as oxygen. Herein, the surface of the semiconductor layer is oxidized, and an oxide layer is formed. In the oxide layer, an element (e.g., III group element) constituting the semiconductor layers of the super-lattice structure and oxygen are bonded to each other so as to form the oxide including, for example, gallium oxide. Since the semiconductor layer and the oxide layer are in contact with each other, dangling bond and pinning of an energy band easily occur at the boundary portion between the semiconductor layer and the oxide layer. In such a mid-infrared image sensor, a dark current that flows through an interface between the semiconductor layer and the passivation film increases. As illustrated in FIG. 8B, the mid-infrared image sensor in the embodiment includes an amorphous layer containing a constituent element in the semiconductor layers of the super-lattice structure, amorphous silicon when silicon is left, and silicon dioxide formed by a reaction at the interface between the semiconductor layer and the passivation film. Therefore, the mid-infrared image sensor in the embodiment has a smaller dark current.

The method for producing a semiconductor light receiving device according to this embodiment may be applied not only to the mid-infrared image sensor, but also to a light-receiving layer having a type-II multi-quantum well structure (MQW structure) made of InGaAs/GaAsSb and used for near-infrared image sensors.

In preferred embodiments, principles of the present invention have been described with reference to the drawings. However, those skilled in the art understand that the present invention can be changed in arrangement and details without departing from the principles. The present invention is not limited to the specific configurations disclosed in the embodiments. Therefore, the Claims and all the modifications and changes within the spirit of the Claims are claimed as the invention.

What is claimed is:

1. A method for producing a semiconductor light receiving device, the method comprising the steps of:
    growing a stacked semiconductor layer on a principal surface of a substrate, the stacked semiconductor layer including a light-receiving layer having a super-lattice structure, the super-lattice structure including a first semiconductor layer and a second semiconductor layer that are stacked alternately;
    forming a mask on the stacked semiconductor layer;
    forming a mesa structure on the substrate by etching the stacked semiconductor layer using the mask so as to form a substrate product, the mesa structure having a side surface exposed in an atmosphere and an oxide layer containing oxygen and a constituent element of the super-lattice structure on the exposed side surface;
    forming a deposited layer on the oxide layer of the side surface of the mesa structure by supplying a silicon raw material, the deposited layer containing amorphous silicon generated from the silicon raw material; and
    after the step of forming the deposited layer, forming a passivation film on the deposited layer of the side surface of the mesa structure, wherein
    the first semiconductor layer contains gallium as a constituent element,
    the second semiconductor layer contains a material different from a material of the first semiconductor layer, and
    in the step of forming the deposited layer, the silicon raw material is supplied without supplying an oxygen raw material containing an oxygen element.

2. The method for producing a semiconductor light receiving device according to claim 1, wherein, in the step of forming the deposited layer, the silicon raw material contains at least one of an inorganic silane compound and an organic silane compound.

3. The method for producing a semiconductor light receiving device according to claim 1, wherein the deposited layer is formed by exposing the substrate product in plasma containing the silicon raw material.

4. The method for producing a semiconductor light receiving device according to claim 1, wherein the deposited layer is formed by applying the silicon raw material on the side surface of the mesa structure.

5. The method for producing a semiconductor light receiving device according to claim 1, wherein the deposited layer is formed by exposing the substrate product in an atmosphere of the silicon raw material.

6. The method for producing a semiconductor light receiving device according to claim 1, wherein the silicon raw material contains at least one of $SiH_4$ and $Si_2H_6$.

7. The method for producing a semiconductor light receiving device according to claim 1, wherein the silicon raw material contains tetraethoxysilane.

8. The method for producing a semiconductor light receiving device according to claim 1, wherein the passivation film is made of silicon dioxide, silicon oxy-nitride, or aluminum oxide.

9. The method for producing a semiconductor light receiving device according to claim 1, wherein
    the first semiconductor layer of the super-lattice structure is made of GaSb, and
    the second semiconductor layer of the super-lattice structure is made of InAs.

10. The method for producing a semiconductor light receiving device according to claim 1, wherein, in the step of the forming the deposited layer, the amorphous silicon in the deposited layer bonds to the oxygen in the oxide layer.

* * * * *